US012644200B2

(12) United States Patent
Zavattari et al.

(10) Patent No.: US 12,644,200 B2
(45) Date of Patent: Jun. 2, 2026

(54) METHODS FOR PRODUCING OFF-ORIENTATION SINGLE CRYSTAL SILICON WAFERS

(71) Applicant: GlobalWafers Co., Ltd., Hsinchu (TW)

(72) Inventors: Carlo Zavattari, Varallo Pombia (IT); Michael Raffeiner, Parcines (IT); Paolo Delpero, Merano (IT); Peter Albrecht, O'Fallon, MO (US); Fabrizio Bonda, Vercelli (IT); Massimo Gariddi, Oleggio (IT); Patrizio Pregnolato, Novara (IT); Pietro Valcozzena, Agordo (IT); Maria Porrini, Novara (IT)

(73) Assignee: GlobalWafers Co., Ltd., Hsinchu (TW)

( * ) Notice: Subject to any disclaimer, the term of this patent is extended or adjusted under 35 U.S.C. 154(b) by 266 days.

(21) Appl. No.: 18/396,266

(22) Filed: Dec. 26, 2023

(65) Prior Publication Data

US 2024/0218557 A1    Jul. 4, 2024

Related U.S. Application Data

(60) Provisional application No. 63/477,735, filed on Dec. 29, 2022.

(51) Int. Cl.
*C30B 15/24* (2006.01)
*C30B 29/06* (2006.01)
*C30B 33/00* (2006.01)

(52) U.S. Cl.
CPC .............. *C30B 15/24* (2013.01); *C30B 29/06* (2013.01); *C30B 33/00* (2013.01)

(58) Field of Classification Search
CPC .......... C30B 15/24; C30B 29/06; C30B 33/00
See application file for complete search history.

(56) References Cited

U.S. PATENT DOCUMENTS 6,387,466 B1 * 5/2002 Fusegawa ............... C30B 29/06
117/917
2005/0120944 A1 * 6/2005 Hong ...................... C30B 15/20
117/13

FOREIGN PATENT DOCUMENTS

CN 107599196 A 1/2018
JP 9-278595 * 4/1997
JP 3817022 B2 * 8/2006

* cited by examiner

*Primary Examiner* — Robert M Kunemund
(74) *Attorney, Agent, or Firm* — Armstrong Teasdale LLP

(57) ABSTRACT

Methods for producing an off-orientation single crystal silicon wafer are disclosed. After a single crystal silicon ingot is grown, the single crystal silicon ingot is ground to increase an off-orientation of the single crystal silicon ingot. A wafer is sliced from ground single crystal silicon ingot. The wafer has an off-orientation greater than the ground single crystal silicon ingot.

20 Claims, 9 Drawing Sheets

Grinding wheel movement during consecutive grinding steps

Grinding wheel movement during consecutive grinding steps

Ingot to be ground

Grinding wheel

Final ingot

First portion to be ground bracket

Grinding axis

α bracket

Ingot axis

First portion to be ground

Longitudinal axis of slicing apparatus

λ

Ground ingot axis

METHODS FOR PRODUCING OFF-ORIENTATION SINGLE CRYSTAL SILICON WAFERS

CROSS-REFERENCE TO RELATED APPLICATIONS

This application claims the benefit of U.S. Provisional Patent Application No. 63/477,735, filed Dec. 29, 2022, which is incorporated herein by reference in its entirety.

TECHNICAL FIELD

The field of the disclosure relates to methods for producing off-orientation single crystal silicon wafers.

BACKGROUND

Electronic device manufacturers increasingly request specialty single crystal silicon wafers such as high off-orientation wafers. Such high off-orientation wafers are often used in silicon-on-insulator applications in which both the handle and donor wafer typically have the same off-orientation. Conventional methods for producing such high off-orientation wafers involve sophisticated processing which reduces throughput and increases cost for producing such wafers. Such processes are also characterized by poor yield.

A need exists for methods for producing such single crystal silicon wafers which allow the wafers to be processed by standard downstream methods and which can be processed without specialty equipment.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present application is directed to a method for producing an off-orientation single crystal silicon wafer. A charge of polycrystalline silicon is added to a crucible disposed in an ingot puller apparatus. The crucible comprising the charge of polycrystalline silicon is heated to cause a silicon melt to form in the crucible. A silicon seed crystal is contacted with the silicon melt. The silicon seed crystal is withdrawn to grow a single crystal silicon ingot. The ingot has a constant diameter portion. A segment of the single crystal silicon ingot is ground to increase an off-orientation and produce a ground single crystal silicon ingot segment. A wafer is sliced from the ground single crystal silicon ingot segment. The wafer has an off-orientation greater than the ground single crystal silicon ingot.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
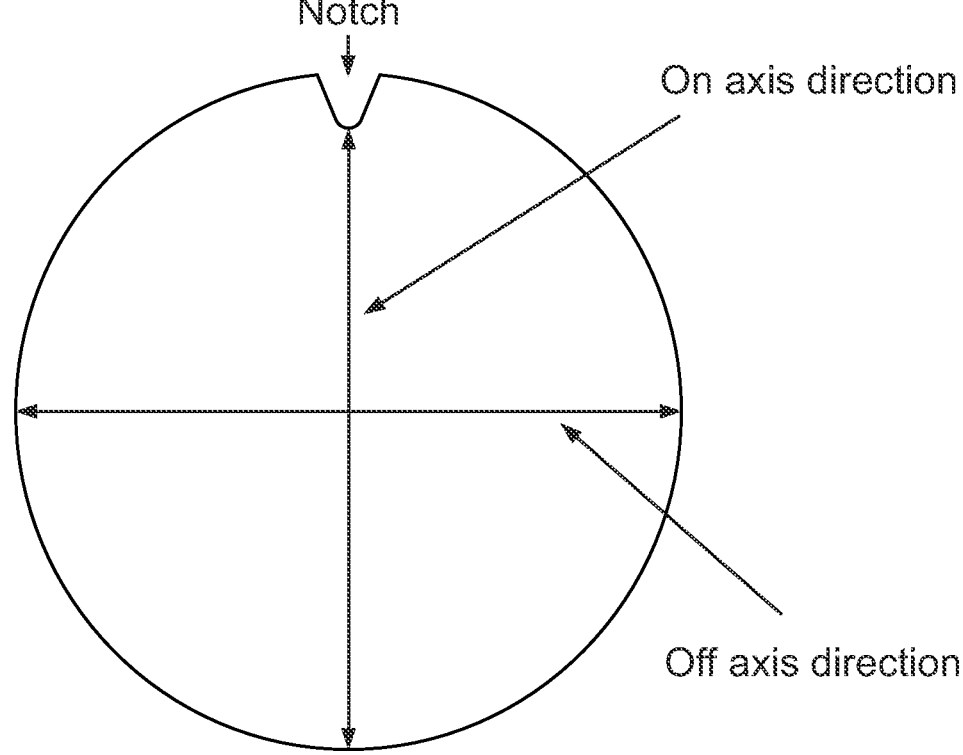
FIG. 1 is a top view of an ingot segment (or wafer thereof) showing the notch and the on-axis crystal orientation toward the notch direction and the off-orientation 90° from the on-axis direction.

Provisions of the present disclosure relate to methods for producing an off-orientation single crystal silicon wafer. As shown in FIG. 1, the wafer may have a target crystal orientation in a first direction (e.g., the notch direction) and an off-orientation in a second direction (e.g., perpendicular direction 90° from the on-axis direction). The methods may involve production of a single crystal silicon ingot, on-axis grinding the single crystal silicon ingot to increase an off-orientation of the single crystal silicon ingot, and slicing wafers from the ground single crystal silicon ingot with the wafers having an off-orientation greater than the ground single crystal silicon ingot.

Production of a Single Crystal Silicon Ingot

Figure 2:
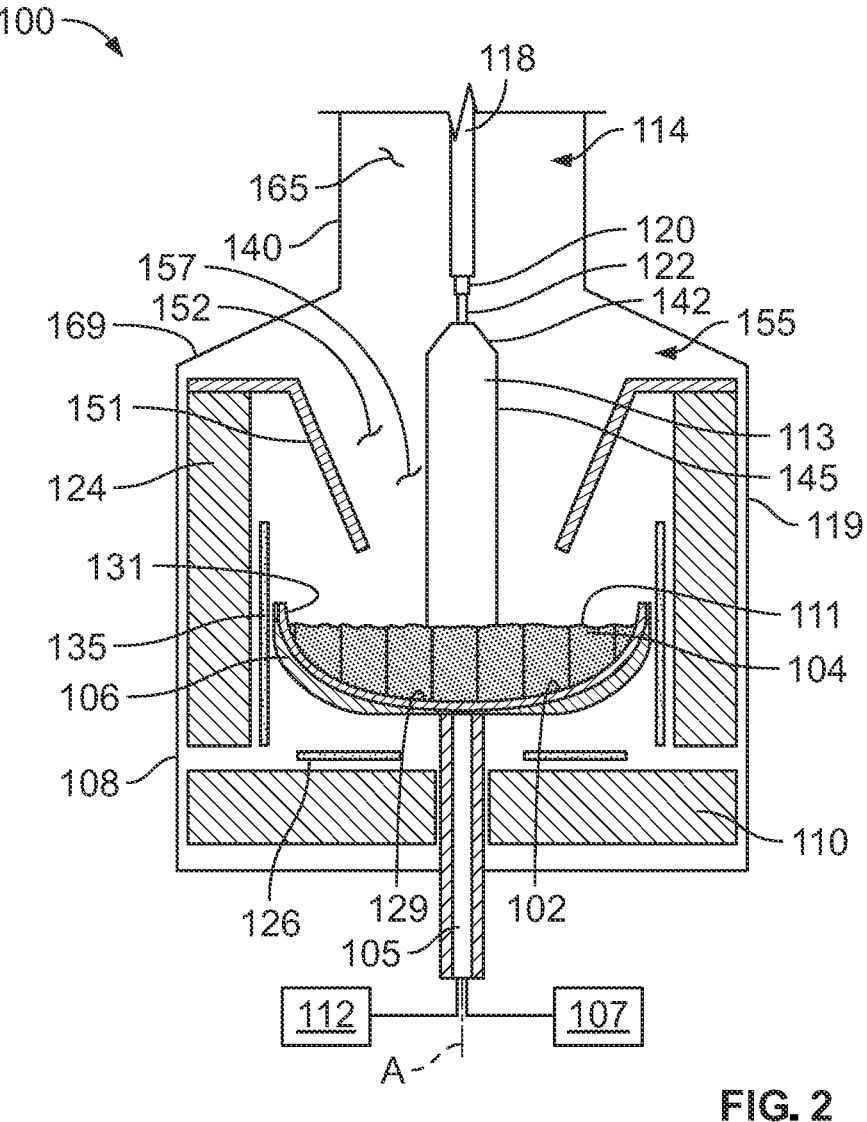
FIG. 2 is a schematic cross-section side view of an ingot puller apparatus.

An example ingot puller apparatus (or more simply "ingot puller") for producing a single crystal silicon ingot is indicated generally as "100" in FIG. 2. The ingot puller apparatus 100 includes a crucible assembly 102 for holding a melt 104 of semiconductor or solar-grade material silicon. The crucible assembly 102 is supported by a susceptor 106.

The ingot puller apparatus 100 includes a crystal puller housing 108 that defines a growth chamber 152 for pulling a silicon ingot from the silicon melt 104 along a pull axis A. The growth chamber 152 includes two portions—a lower growth chamber 155 (or simply "lower chamber") and an upper growth chamber 165 (or simply "upper chamber") disposed above the lower growth chamber 155. The hotzone of the ingot puller apparatus 100 (e.g., crucible, reflector assembly, susceptor, heaters, and the like) is disposed within the lower chamber 155. During ingot growth, the ingot 113 is pulled through the lower chamber 155 and continues to be pulled through the upper chamber 165 as the ingot lengthens.

The crystal puller housing 108 includes a domed lower segment 119 that defines the lower chamber 155 and an upper segment 140 that defines the upper chamber 165. The lower domed segment 119 includes a dome-shaped portion 169 which tapers in size to the diameter of the upper segment 140. The upper segment 140 is generally cylindrical in shape and includes a lower end and an upper end. The upper segment 140 of the crystal puller housing 108 is removably connected to the lower segment 119 (e.g., by fasteners, gaskets or the like).

The crucible assembly 102 is disposed in the lower chamber 155. The crucible assembly 102 has a sidewall 131 and floor 129 and rests on a susceptor 106. The susceptor 106 is supported by a shaft 105. The susceptor 106, crucible assembly 102, shaft 105, and ingot 113 have a common longitudinal axis or "pull axis" A.

A pulling mechanism 114 is provided within the ingot puller apparatus 100 for growing and pulling an ingot 113 from the melt 104. The pulling mechanism 114 includes a pull cable 118, a seed holder or chuck 120 coupled to one end of the pull cable 118, and a seed crystal 122 coupled to the chuck 120 for initiating crystal growth. One end of the pull cable 118 is connected to a pulley (not shown) or a drum (not shown) of the pulling mechanism 114 and the other end is connected to the chuck 120 that holds the seed crystal 122. The pulling mechanism 114 includes a motor that rotates the pulley or drum.

In operation, the seed crystal 122 is lowered to contact the surface 111 of the melt 104. The pulling mechanism 114 is operated to cause the seed crystal 122 to rise. This causes a single crystal ingot 113 to be pulled from the melt 104.

During heating and crystal pulling, a crucible drive unit 107 (e.g., a motor) rotates the crucible assembly 102 and susceptor 106. A lift mechanism 112 raises and lowers the crucible assembly 102 along the pull axis A during the growth process. For example, the crucible assembly 102 may be at a lowest position (near the bottom heater 126) in which a charge of solid-phase silicon previously added to the crucible assembly 102 is melted. Crystal growth commences by contacting the melt 104 with the seed crystal 122 and lifting the seed crystal 122 by the pulling mechanism 114.

A crystal drive unit (not shown) may also rotate the pulling cable 118 and ingot 113 in a direction opposite the direction in which the crucible drive unit 107 rotates the crucible assembly 102 (e.g., counter-rotation). In embodiments using iso-rotation, the crystal drive unit may rotate the pulling cable 118 in the same direction in which crucible drive unit rotates the crucible assembly 102.

The ingot puller apparatus 100 includes bottom insulation 110 and side insulation 124 to retain heat in the puller apparatus 100. In the illustrated embodiment, the ingot puller apparatus 100 includes a bottom heater 126 disposed below the crucible floor 129. The crucible assembly 102 may be moved to be in relatively close proximity to the bottom heater 126 to melt the solid silicon charged to the crucible assembly 102.

According to the Czochralski single crystal growth process, a quantity of solid-phase silicon such as polycrystalline silicon, or "polysilicon", is initially charged to the crucible assembly 102. The semiconductor or solar-grade solid silicon that is introduced into the crucible assembly 102 is melted by heat provided from one or more heating elements. Once the melt 104 is fully formed, the seed crystal 122 is lowered and contacted with the surface 111 of the melt 104. The pulling mechanism 114 is operated to pull the seed crystal 122 from the melt 104. The resulting ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104.

The crystal growth process may be a batch process in which solid silicon is initially added to the crucible assembly 102 to form a silicon melt without additional solid-silicon being added to the crucible assembly 102 during crystal growth. In other embodiments, the crystal growth process is a continuous Czochralski process in which an amount of silicon is added the crucible assembly during ingot growth.

The ingot puller apparatus 100 includes a side heater 135 and a susceptor 106 that encircles the crucible assembly 102 to maintain the temperature of the melt 104 during crystal growth. The side heater 135 is disposed radially outward to the crucible sidewall 131 as the crucible assembly 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

The ingot puller apparatus 100 may include a reflector assembly 151. The reflector assembly 151 includes an opening 157 through which the single crystal silicon ingot 113 is pulled during ingot growth. The ingot puller apparatus 100 may include an inert gas system to introduce and withdraw an inert gas such as argon from the growth chamber 152.

The illustrated ingot puller apparatus 100 is an example and any ingot puller apparatus 100 produces a single crystal silicon ingot may be used unless stated otherwise.

The resulting crystal 113 may have any target crystal orientation such as a crystal 113 grown along the {20-1-1} orientation, the {14-1-0} orientation, the {1-1-0} orientation, the {15-17-1} orientation, the {1-1-1} orientation, or the {7-7-6} orientation. The ingot may be grown along the target orientation by using a seed crystal 122 that is cut along the desired growth orientation of the ingot. In some embodiments, the off-orientation of the as-grown ingot is at least 1°, at least 2°, or at least 4° (e.g., {20-1-1} crystal, {14-1-0} crystal or {7-7-6} crystal).

Ingot Grinding

After the ingot 113 has been grown and cropped into an ingot segment (which may be the ingot as cropped or may be the cropped ingot divided into additional sections), the ingot segment may undergo "on-axis" grind in which a crystallographic plane is met by grinding in a grinding apparatus and also in which the off-orientation of the ingot is increased. The on-axis grind may meet a specific direction (axis) that is not met by the crystal but is input from the grind. The on-axis grind achieves two objectives—to meet the desired alignment along the perpendicular direction (e.g., {1-0-0}) (which may be the notch direction) and extending the off-orientation, such as by increasing the off-orientation an additional 1° to 2° from the as-grown orientation (e.g., from 4° as grown to 5-5.5° after grinding).

The on-axis grind may be a two-step grinding process or a one-step grinding process (e.g., in which brackets are glued to the ingot segment). The grinding process (e.g., one-step process or two-step process) may be performed on an ingot grinding apparatus shown schematically in FIG. 3. The grinding apparatus secures the ingot segment such that the grinding axis and the longitudinal ingot axis (or "center axis") form an angle α such that the target crystal orientation (e.g., in the notch direction) and/or off-orientation may be increased (e.g., in one or two steps as discussed below). The grinding apparatus may include brackets, clamps or face-plates to secure the ingot segment within the apparatus. The ingot grinding apparatus may include a tilt table in which the ingot segment is tilted relative to the grinding axis. Any grinding apparatus which allows the ingot segment to be ground on-axis may be used unless stated otherwise.

Figure 3:
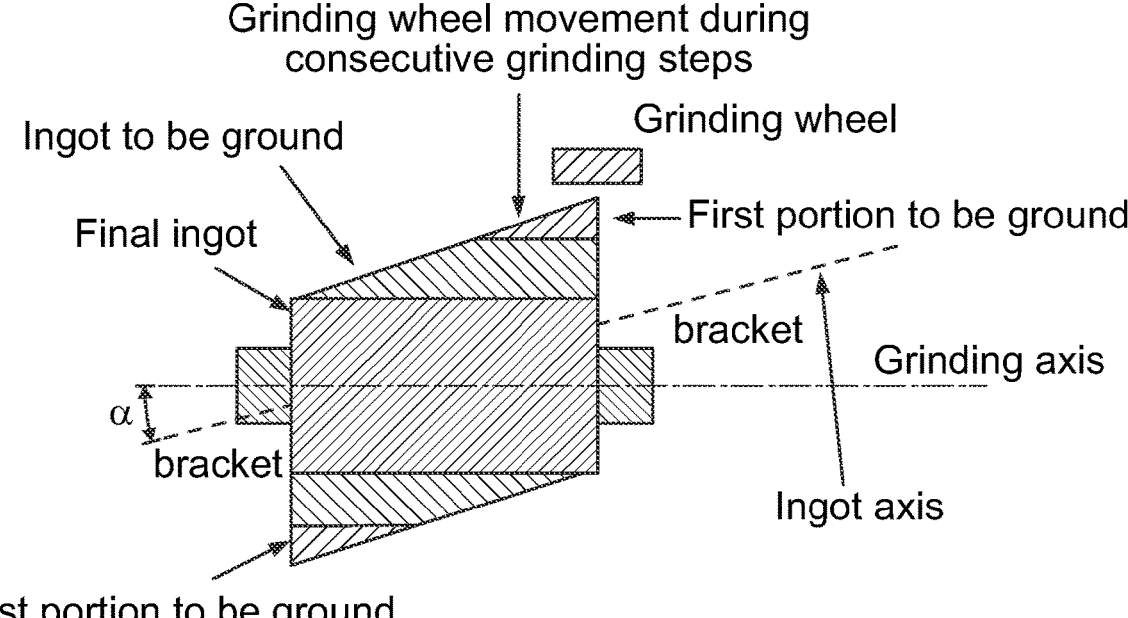
FIG. 3 is a schematic of an ingot and grinding apparatus used to increase the off-orientation.

Because the longitudinal center axis of the ingot segment and the grinding axis are angled, grinding results in uneven removal of material from the ingot segment. As shown in FIG. 3, the grinding wheel of the ingot grinding apparatus initially contacts a first portion of the ingot segment. As ingot grinding proceeds, a longer portion of the ingot segment contacts the grinding wheel. The final ingot segment may be achieved in one or two steps (or more) as discussed below.

In the two-step grinding process, the cropped segment may initially be checked for orientation along the off-axis direction (i.e., perpendicular to the notch direction) before grinding. The inspection may be performed on an X-ray station to determine the amount of tilting to be applied during the first grinding step. The x-ray station includes a platform which supports the ingot segment and includes an x-ray generator. The x-ray station may detect the photon absorption intensity and provide an analogical indication of detected current. When the angle of diffraction meets the Bragg law, the absorption has reached a maximum. By determining the angle (typically $1°$-$2°$) and by having the segment length, the amount of off-set to be used during the grinding may be determined.

Once the tilt angle is determined, the ingot segment is loaded onto the grinding apparatus and is aligned to the grinding axis with the up-measured offset. The offset may be calculated by goniometric formula, starting from the tilt angle. A contact probe may be installed on the frame of the grinding apparatus and is positioned on the segment side surface to tilt the segment to reproduce the needed offset. The tilting may be provided by applying a force to the segment surface (e.g., with a mallet).

The ingot segment is then ground to a diameter that is larger than the final target diameter (typically 3 to 3.5 mm bigger than final target), to allow a second grinding step to subsequently compensate the orientation of the other axis and to reach the proper final diameter. Before the second grinding step, the "oversized" ground ingot segment is again measured in an X-ray station to calculate the discrepancy between the surface and the crystal orientation along the other axis. In some embodiments, this operation involves a relatively high degree of accuracy because any discrepancies from the target are not corrected during slicing (i.e., because slicing increases the off-orientation in the other direction). The offset/tilt may be determined by the same method as the first grinding step with the direction being shifted $90°$ relative to the first step. Once the segment is loaded onto the grinding apparatus, the ingot segment is tilted relative to the grinding axis and grinding is performed to reach the target diameter for wafer slicing.

In some embodiments, a one-step grind is performed. The one-step grinding process may involve a gluing station (e.g., in which brackets which secure the ingot segment are glued) to allow the desired degree of off-orientation to be achieved while also achieving the on-axis target (i.e., "dual direction" on-axis grind). Example gluing stations may be obtained from Delta Technologies International (Gradignan, France).

In the one-step grind, the two brackets which hold the ingot segment during grinding are glued on the two flat ends of the ingot segment with a gluing station to provide the proper compensation between the desired crystal orientation and the actual crystal orientation.

Any grinding system which can provide a relatively precise orientation or a mechanism to compensate orientation errors may be used. Generally any crystal may be ground ($\{1,0,0\}$, $\{1,1,1\}$, etc.; on-axis, off-axis, etc.) according to the disclosed methods.

Figure 4:
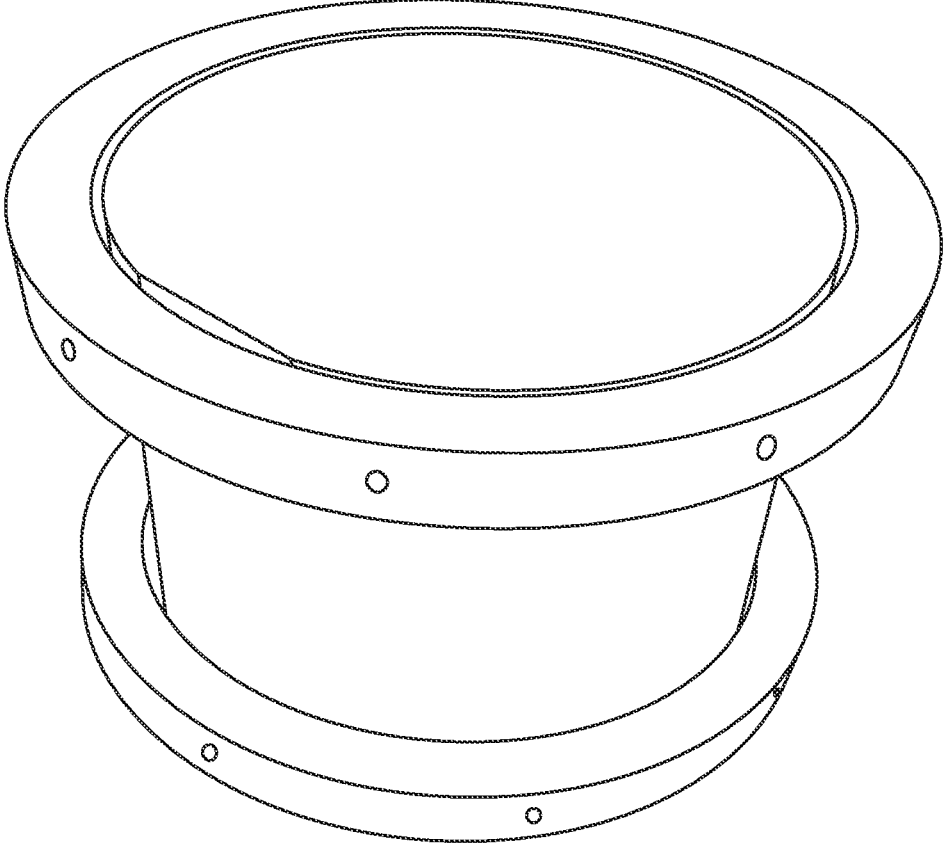
FIG. 4 is a perspective view of a cropped silicon ingot with two rings mounted thereto as indexes for downstream x-ray and gluing stations.

In the one-step grind, two different conditions along the notch and at $90°$ from the notch are achieved. Notch location may be achieved before grinding. An x-ray station may be used in which the as grown and cropped ingot (and optionally further divided ingot segment) is placed vertically on the x-ray plate and the notch location is marked on the flat end of the segment. The notched ingot segment may then be checked by x-ray to find the correct crystal orientation for transfer to the grinding apparatus. Two rings may be mounted to the ingot segment as indexes for both the x-ray station and gluing station as shown in FIG. 4.

Figure 5:
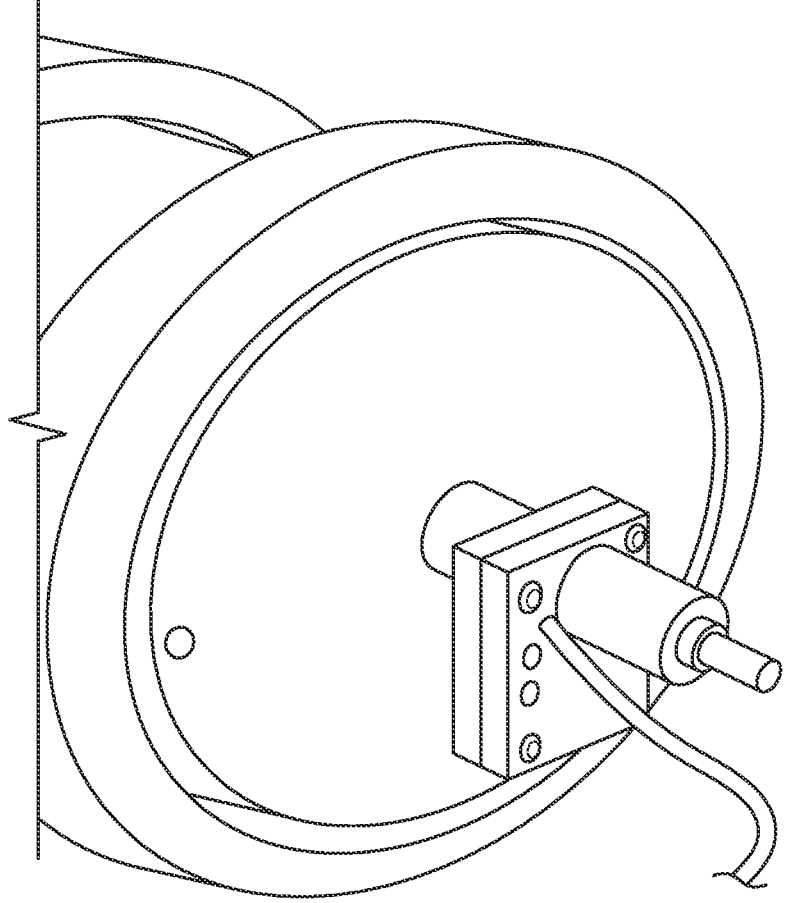
FIG. 5 is a perspective view of the ingot segment with a bracket glued thereto.
Figure 6:
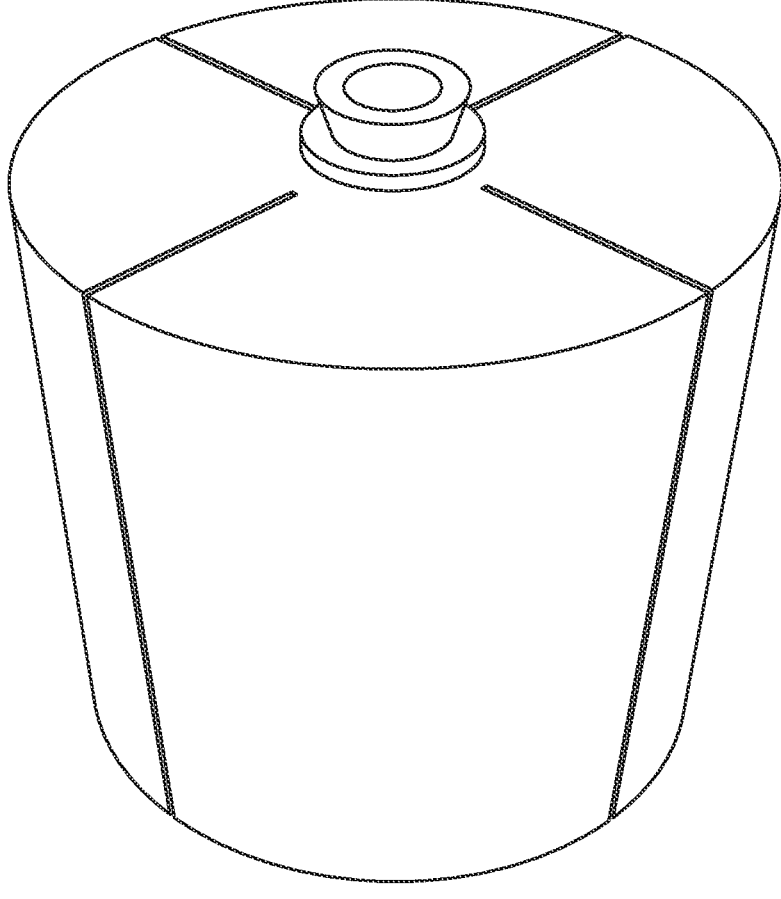
FIG. 6 is a perspective view of an ingot segment with a bracket connected thereto.

Once on the x-ray station, calculations related to the orientation target and off-orientation in the perpendicular direction are performed (e.g., at four positions) to determine the angles at which the brackets are glued onto the ingot segment. The brackets are glued (FIG. 5) to achieve the target deflection of the horizontal table and the target notch rotation. As shown in FIG. 6, the brackets are glued to the flat ends of the segment (e.g., or double-side taped). The gluing station may include bracket holders that secure the brackets while they are forced into contact with each flat end of the segment. After curing, the ingot segment with the two brackets attached thereto is removed from the curing station and the indexing rings are removed.

Figure 7:
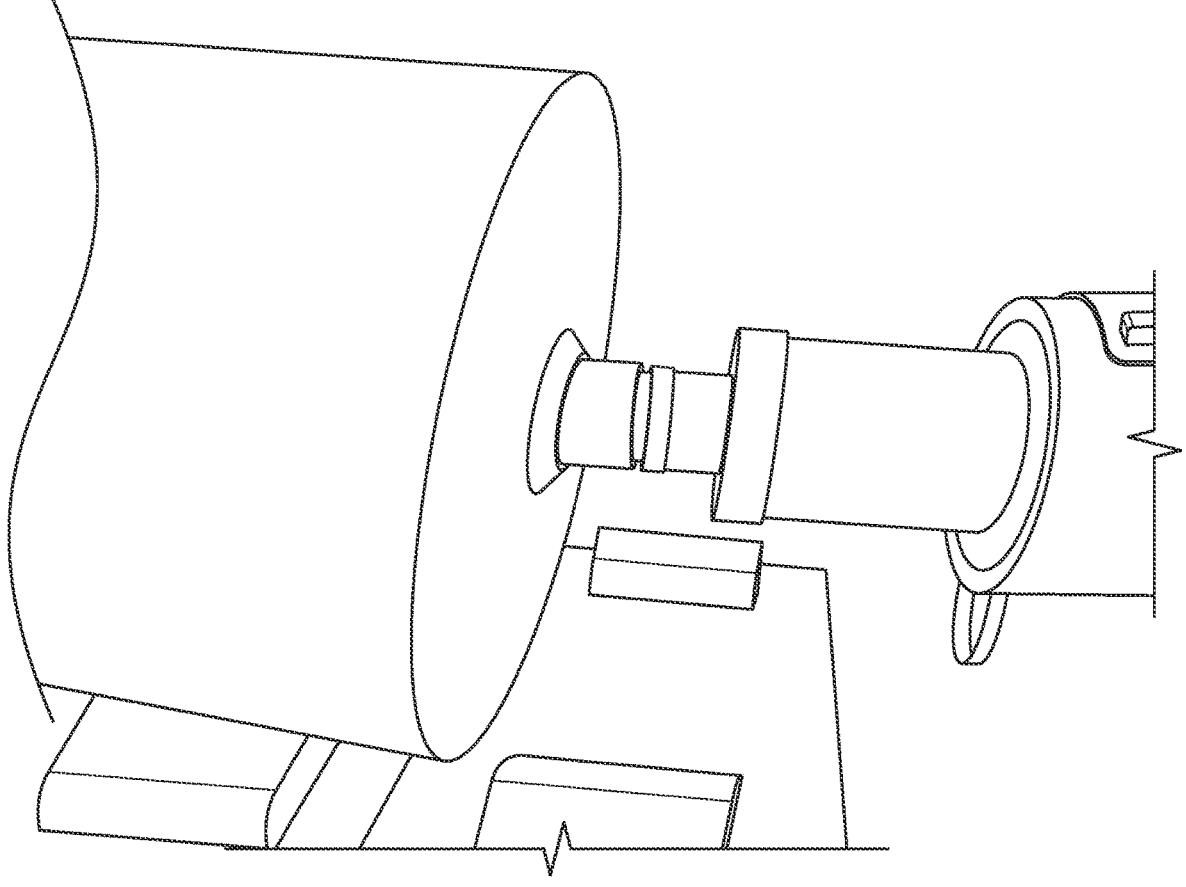
FIG. 7 is a front view of the ingot segment with a bracket connected thereto mounted in a grinding apparatus.

The segment with brackets attached thereto is then inserted in the grinding apparatus (FIG. 7), clamped and the segment is ground on-axis. After grinding, the glued brackets are removed and the ingot segment is measured again with X-ray to verify that the target orientations were achieved. If the segment was grown sufficiently thick, orientation may be verified after a first grinding, and a second grinding to the desired diameter may be performed.

In another embodiment, rather than use of a gluing station, the ingot segment may be pre-ground (e.g., to a diameter which is larger than the desired final diameter). The pre-ground ingot segment is checked on an X-ray station to determine the off-orientation location and the angle is transformed (e.g., by goniometric formula) into a distance. The bracket position is marked on the ingot surface based on the calculated distance from the ingot center or side surface and brackets are mounted based on the desired off-axis grind.

Wafer Slicing

Figure 8:
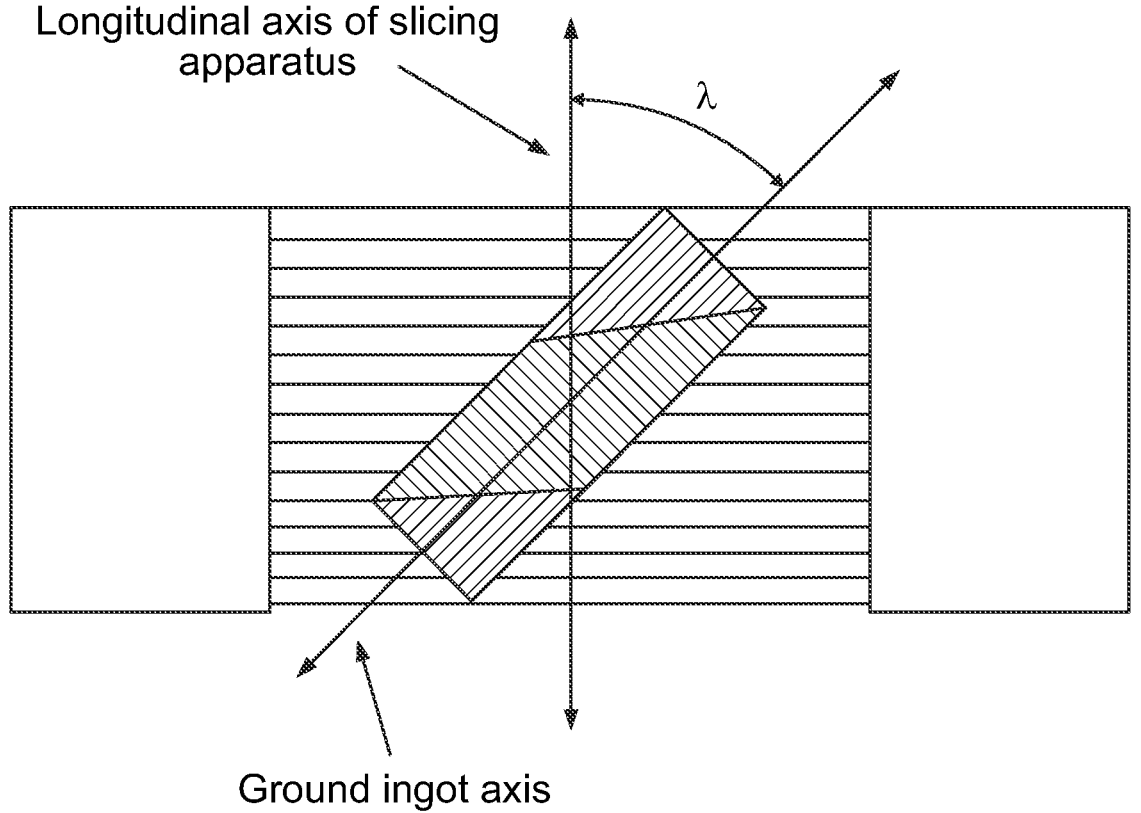
FIG. 8 is a schematic of a slicing process in which the off-orientation of the sliced wafers increases.

Once the ingot segment has been ground, wafers are sliced from the single crystal silicon ingot segment such that the wafer has an off-orientation greater than the ground single crystal silicon ingot. Slicing may further increase the off-orientation such as by another $2°$, another $3°$, another $4°$, or another $4.5°$ (e.g., increased by $4.5°$ to $5°$). The ingot may be sliced in a slicing apparatus that includes diamond coated wire or loose abrasive slicing may be used. As shown in FIG. 8, the slicing apparatus secures the ingot segment such that the longitudinal axis of the slicing apparatus (which is $90°$ offset from the slicing direction) and the longitudinal ingot axis form an angle $\lambda$ such that the off-orientation is increased to meet the target (e.g., customer target).

The slicing method may involve gluing workplates to the round side surface of the ingot segment and positioning the ingot segment with workplates attached thereto into the slicing apparatus. For gluing of the workplate, the ingot segment may be placed on an x-ray station to determine the angles at which the workplate are glued onto the ingot segment. The workplates are glued to achieve the target deflection and the target notch rotation. The on-axis grind (described above) reduces the angle to be corrected by slicing which allows longer ingots to be sliced because the ingot may better fit into the main roller span. This reduces the amount of lost length (i.e., increases the amount of wafers produced in a given length of ingot segment).

After slicing, the wafers are demounted and cleaned. Wafer inspection may be performed using standard tools. Edge rounding may be performed and, in some embodiments, is performed in two steps to achieve final diameter. In embodiments in which the ingot segment is ground on-axis along the notch direction, the notch may be cut on-axis and along the short diameter. This assists in edge rounding and for a dual removal process to ensure the notch survives the removal steps. After edge rounding, the wafers may be processed as standard wafers in downstream processes.

The resulting single crystal silicon wafers may have any suitable surface orientation such as {1-0-0}. In some embodiments, the wafers have an off-orientation of at least 9.0° (e.g., from 9.0° to 10.5° or from 9.0° to 10.0°). The off-orientation may be in the notch direction (grown along the [1-1-0] direction) or at 90° from the notch. In other embodiments, the resulting single crystal silicon wafers are orientated along the {15-17-1} starting from a {1-1-0} crystal which have an off-orientation from 9.0° to 10.5°. The wafers may have any suitable diameter (e.g., 200 mm or 300 mm).

Figure 9:
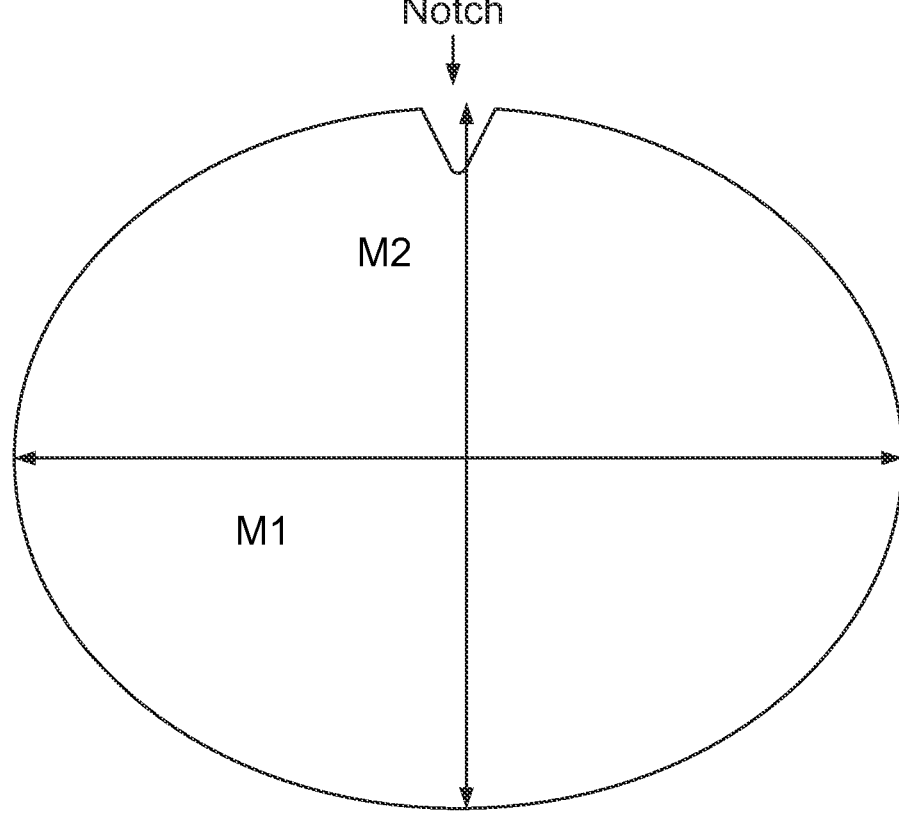
FIG. 9 is a schematic top view of an oval wafer produced by the methods of the present disclosure.

As shown in FIG. 9, the resulting wafers may have an oval shape due to the processing described above. For example, the wafers may have a major axis $M_1$ that is from 1-5 mm longer than the minor axis $M_2$. The notch may be positioned on the minor axis $M_2$.

Compared to conventional methods for producing single crystal silicon wafers, the methods of the present disclosure have several advantages. By performing a dual axis grind, high off-orientation wafers (e.g., at least 9°) may be produced without processing in extreme conditions (e.g., by modifying the wire saw). The methods allow for CZ growth along known growth processes (e.g., a crystal orientation of {20-1-1} which is relatively close to the more common {1-0-0}). The resulting wafers are not highly oval which allows the wafers to fit within standard cassettes for downstream processing. In embodiments in which the ingot is ground on-axis along the notch direction, the notch may be cut on-axis and along the short diameter. This assists in edge rounding and for a dual removal process to ensure the notch survives the removal steps.

In embodiments in which a one-step grind is used, the grind may be more accurate relative to a two-step grind. In embodiments in which a dual direction on-axis grind is used, the angle to be corrected during slicing may be reduced which allows longer ingot segments to be used. The yield benefit of using the on-axis grind may be up to 10% or more.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment (s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for producing an off-orientation single crystal silicon wafer, the method comprising:
   adding a charge of polycrystalline silicon to a crucible disposed in an ingot puller apparatus;
   heating the crucible comprising the charge of polycrystalline silicon to cause a silicon melt to form in the crucible;
   contacting a silicon seed crystal with the silicon melt;
   withdrawing the silicon seed crystal to grow a single crystal silicon ingot, the ingot having a constant diameter portion;
   grinding a segment of the single crystal silicon ingot to increase an off-orientation and produce a ground single crystal silicon ingot segment, the single crystal silicon ingot segment being ground in a grinding apparatus, the grinding apparatus grinding the single crystal silicon ingot along a grinding axis, the single crystal silicon ingot having a longitudinal axis that forms an angle with the grinding axis during grinding, wherein grinding the single crystal silicon ingot segment comprises a one-step on-axis grinding step in which the orientation of the ingot is changed in dual directions without removing the ingot segment from the grinding apparatus; and
   slicing a wafer from the ground single crystal silicon ingot segment, the wafer having an off-orientation greater than the ground single crystal silicon ingot segment.

2. The method as set forth in claim 1 wherein the wafer is off-orientation by at least 9.0°.

3. The method as set forth in claim 2 wherein the wafer is off-orientation by less than 10.5°.

4. The method as set forth in claim 2 wherein the wafer is off-orientation by less than 10.0°.

5. The method as set forth in claim 1 wherein the silicon seed crystal is withdrawn to grow a single crystal silicon ingot along the {20-1-1} orientation, along the {14-1-0} orientation, along the {1-1-0} orientation, along the {15-17-1} orientation, along the {1-1-1} orientation, or along the {7-7-6} orientation.

6. The method as set forth in claim 1 comprising determining a crystallographic orientation of the single crystal silicon ingot segment prior to grinding.

7. The method as set forth in claim 1 wherein the dual direction grind includes a first direction which is a notch direction and a second direction perpendicular to the notch direction in which the off-orientation of the ingot segment is increased.

8. The method as set forth in claim 1 wherein the method comprises gluing a bracket to at least one flat end of the single crystal silicon ingot.

9. The method as set forth in claim 1 wherein the method comprises gluing a bracket to each flat end of the single crystal silicon ingot.

10. The method as set forth in claim 1 wherein a batch of wafers are sliced from the ground single crystal silicon ingot segment.

11. The method as set forth in claim 1 wherein slicing a wafer from the ground single crystal silicon ingot segment comprises positioning the ingot segment in a slicing apparatus such that the longitudinal axis of the slicing apparatus and the longitudinal ingot axis form an angle to increase the off-orientation of the ingot segment.

12. The method as set forth in claim 1 wherein the ingot segment is produced by cropping the single crystal silicon ingot without further dividing the cropped single crystal silicon ingot.

13. The method as set forth in claim 1 wherein the ingot segment is produced by:
   cropping the single crystal silicon ingot; and
   dividing the cropped single crystal silicon ingot into two or more ingot segments.

14. A method for producing an off-orientation single crystal silicon wafer, the method comprising:
   adding a charge of polycrystalline silicon to a crucible disposed in an ingot puller apparatus;
   heating the crucible comprising the charge of polycrystalline silicon to cause a silicon melt to form in the crucible;
   contacting a silicon seed crystal with the silicon melt;
   withdrawing the silicon seed crystal to grow a single crystal silicon ingot, the ingot having a constant diameter portion;
   grinding a segment of the single crystal silicon ingot to increase an off-orientation and produce a ground single crystal silicon ingot segment, the single crystal silicon ingot being ground in a grinding apparatus, the grinding apparatus grinding the single crystal silicon ingot along a grinding axis, the single crystal silicon ingot having a longitudinal axis that forms an angle with the grinding axis during grinding, wherein grinding the single crystal silicon ingot segment comprises a two-step on-axis grinding step in which (1) a crystallographic orientation of the ingot segment is changed in a notch direction and (2) an off-orientation of the ingot segment in a direction 90° from the notch direction is changed in different grinding steps; and
   slicing a wafer from the ground single crystal silicon ingot segment, the wafer having an off-orientation greater than the ground single crystal silicon ingot segment.

15. The method as set forth in claim 14 wherein the first step changes the off-orientation and the second step changes the orientation in the notch direction.

16. The method as set forth in claim 14 comprising determining the crystallographic orientation of the single crystal silicon ingot segment between the first and second grinding steps.

17. The method as set forth in claim 14 wherein the wafer is off-orientation by at least 9.0°.

18. The method as set forth in claim 17 wherein the wafer is off-orientation by less than 10.5°.

19. The method as set forth in claim 14 wherein the silicon seed crystal is withdrawn to grow a single crystal silicon ingot along the {20-1-1} orientation, along the {14-1-0} orientation, along the {1-1-0} orientation, along the {15-17-1} orientation, along the {1-1-1} orientation, or along the {7-7-6} orientation.

20. The method as set forth in claim 14 wherein slicing a wafer from the ground single crystal silicon ingot segment comprises positioning the ingot segment in a slicing apparatus such that the longitudinal axis of the slicing apparatus and the longitudinal ingot axis form an angle to increase the off-orientation of the ingot segment.

* * * * *